June 2, 1970 W. R. WANESKY 3,515,607
METHOD OF REMOVING POLYMERISED RESIST
MATERIAL FROM A SUBSTRATE
Filed June 21, 1967

INVENTOR
W.R. WANESKY
BY R. P. Miller
ATTORNEY

United States Patent Office 3,515,607

Patented June 2, 1970

3,515,607
METHOD OF REMOVING POLYMERISED RESIST MATERIAL FROM A SUBSTRATE

William R. Wanesky, Wecosville, Pa., assignor to Western Electric Company, Incorporated, New York, N.Y., a corporation of New York Filed June 21, 1967, Ser. No. 647,675
Int. Cl. B08b 3/02; G03c 11/24; H01l 7/00
U.S. Cl. 156—17 6 Claims

ABSTRACT OF THE DISCLOSURE

A layer of resist material bonded to a mounted substrate and having a peripheral lip projecting beyond the edges of the substrate is removed by projecting against (1) the edge of the projecting lip and (2) the plate on which the substrate is mounted, a stream of fluid having a sufficient effective force component acting upon the projecting lip to initiate separation of the resist from the substrate. The stream is then directed against the newly exposed portion of the resist layer to completely remove the layer from the substrate.

BACKGROUND OF THE INVENTION

In the fabrication of electrical devices, such as printed circuit boards, semiconductors, beam lead devices, and the like, the use of etch resistant masking materials plays an important role. Resist materials are used to protect a desired portion of an electrical device, or to protect a desired pattern or matrix on an etchable substrate. Suitable resist materials consist of any material that will adhere tenaciously to the surface of an etchable substrate and protect it from the corrosive attack of an etchant. However, besides adhering tenaciously to a substrate, a suitable resist material must possess certain other qualities, particularly that of being easily removed from the substrate after the desired etching step has been completed.

Among the more preferred resist materials are those that can be coated on a preselected portion of an etchable substrate with a high degree of resist acuity, a close correspondence between the resist pattern and the mask used in its application. The need for high resist acuity is indispensable when fabricating very small electrical devices. When high resist acuity is required, the more preferred resist materials are those known in the art as photoresists. Generally speaking, photoresist materials are emulsions of low molecular weight polymers, mixed with photosensitizers, which may be cross-linked by a photochemical decomposition reaction. One such photoresist material cross-links by the photochemical decomposition reaction of aromatic azides and may be purchased from Eastman Kodak Company, Rochester, N.Y., under the name "KTFR" resist.

In practice, a thin layer of the photoresist material is coated over the entire surface of an etchable substrate and an opaque mask having a predetermined cutout pattern thereon is placed over the resist. The masked resist is then exposed to ultraviolet light whereby the unmasked portion undergoes a chemical change that alters its solubility. The change in solubility of the exposed portion of resist determines whether it is classified as a positive resist or a negative resist, and determines the necessary cut-out pattern on the opaque mask. When a negative resist, such as "KTFR" resist, is used, the unexposed portion of the resist is the more soluble portion and is rinsed from the surface of the etchable substrate. The selectively protected substrate is then treated with an etching solution to remove all the unprotected areas. The unetched portion of the substrate is then rinsed free from excess etching solution and the resist material is removed therefrom.

In the past there has been difficulty in removing the resist material from a completed electrical device, and this difficulty has been greatly magnified when the completed device was very small and fragile.

When a very small and fragile device is fabricated, the etchable substrate is generally bonded to a support or mounting plate with a suitable etch resistant bonding material such as wax. It is important that the resist removal step does not affect the bonding material securing the small and fragile device in place, because any disturbance in the orientation of the device may result in severe damage thereto. It is also important to maintain the device in its original preselected orientation to facilitate subsequent device handling procedures.

Ideally, the resist material would be removed by subjecting the resist material to a selective solvent that would not effect the bonding material securing the device in place. Unfortunately, no such solvent is known, and it was thought necessary to employ various combinations of solvents, laps, and sprays to effectively remove the resist material.

One prior technique involves lapping the resist-coated surface of a mounted device against a hard, smooth paper slightly moistened with a resist stripper such as "J–100" resist stripper, commercially available from Indust-Ri-Chem Laboratories, Richardson, Tex. Following lapping, the device is rinsed with deionized water to remove the resist stripper. Although this technique adequately removes the resist material, there is some likelihood that the device will be torn from the bonding material and damaged.

Another prior technique involves spraying a mounted device with "Cobehn" resist stripper available from the Cobehn Company, Fairfield, N.J. This technique removes not only the resist material but also some of the bonding material securing the device to the mounting plate. Depending upon the size of the device, removal of some of the bonding material may cause subsequent handling difficulties or damage to the fragile device.

Accordingly, it is desirable to facilitate resist removal by a simple, cheap and reliable technique that will neither damage a fragile electrical device nor disrupt its orientation on a mounting plate.

In furtherance of this end, the particular problem to be treated by this invention is the removal of photoresist material from the surface of a fragile electrical device employing neither an expensive solvent nor a destructive abrasion technique.

SUMMARY OF THE INVENTION

One solution to this problem is provided by the method of the instant invention which, for the sake of brevity, is described herein only in connection with the removal of photoresist material from the surface of a beam lead device. Examples of beam lead devices are disclosed in Pats. 3,287,612 and 3,335,338 issued to M. P. Lepselter.

A beam lead device is a type of semiconductor device in which the leads form an integral part of the device and extend out from a semiconductor body of the device like cantilever beams to form both the electrical and the mechanical connections to a header or substrate. A typical beam lead device may be 0.010 to 0.052 inch in length by 0.013 to 0.052 inch in width by 0.002 to 0.007 inch in thickness and may have leads ranging from 0.5 to 1 mil in thickness. This small size renders a beam lead device very fragile and presents difficult handling problems. A typical beam lead device is fabricated from a semiconductor wafer by a plural step process including among its steps the following:

(a) Forming a plurality of active sites on one side of the semiconductor wafer;

(b) Plating conductive patterns on the active side of the wafer corresponding to the leads of a plurality of completed devices;

(c) Bonding the semiconductor wafer, active side down, to a mounting plate with wax or some other suitable water insoluble bonding material;

(d) Applying a layer of resist material to the nonactive side of the semiconductor wafer corresponding to the desired location of completed beam lead devices;

(e) Etching the portions of the semiconductor wafer that are not protected by the resist material to form a plurality of isolated devices;

(f) Rinsing the isolated beam lead devices to rid them of excess etchant; and (g) Removing the resist material from the surface of the beam lead devices.

The present invention is concerned only with the last-mentioned step in the fabrication of beam lead devices; the step of removing resist material from the surface of the isolated devices.

In accordance with the present invention, the photoresist material is removed from the surface of a beam lead device by projecting or impinging a stream of fluid at an acute angle against the edge of the resist material and against the bonding material on the surface of the mounting plate adjacent the device. Part of the fluid stream acts directly on the edge of the resist material and part of the fluid stream rebounds from the surface of the bonding material on the mounting plate to act against the underside of a peripherally projecting lip of resist material formed by undercutting or etching away some of the semiconductor body of the device under the resist material during the etching step, step (e), described above. The combination of the effective forces acting against the edge and underside of the peripheral lip of resist material is sufficient to overcome the adhesive force between the device and the resist material and initiate separation of the resist from the device.

Use of the method of this invention meets with best results when the bonding material securing the device to the mounting plate has a very low solubility in the impinging fluid stream, and when the fluid stream is directed toward the periphery of the mounting plate. The latter qualification prevents the possibility of removing the bonding material and the device from the mounting plate while removing the resist material from the device. It might also be noted that method of this invention permits use of water as the fluid stream when the bonding material securing the device to the mounting plate is water insoluble.

The advantages of the method of the instant invention are numerous. First, the stream of fluid used as the resist removing agent may consist of almost any composition, so long as it does not affect the device or the material bonding the device to the mounting plate. Secondly, there is no need for plural step abrasions, laps, sprays, or solvent treatments to remove the resist material from a completed device. Finally, there is little or no possibility of damaging a device or disrupting its orientation in the mounting plate.

BRIEF DESCRIPTION OF THE DRAWING

The above-mentioned, and other significant advantages of this invention and the method of attaining them will become more apparent, and the invention itself will be best understood by reference to the following detailed description of the invention taken in conjunction with the drawing, wherein.

DETAILED DESCRIPTION

Figure 1:
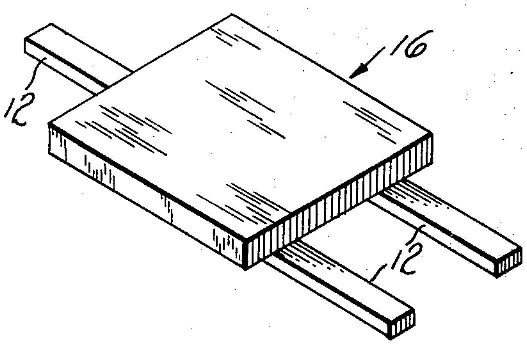
FIG. 1 is a simplified isometric view of a typical, three-lead, beam lead device.
Figure 2:
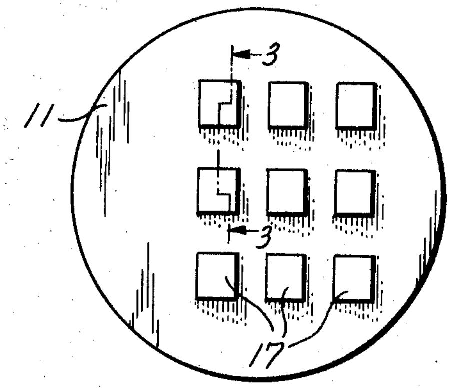
FIG. 2 is a top elevation of a semiconductor wafer coated with a photoresist material in preselected areas corresponding to the location of completed beam lead devices.
Figure 3:
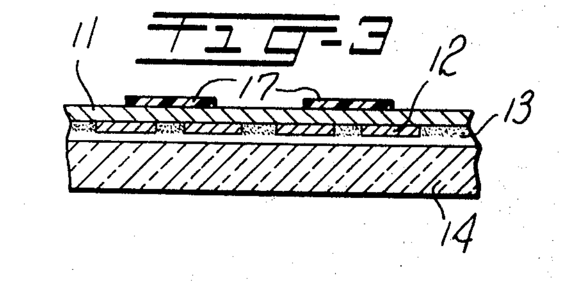
FIG. 3 is a sectional view taken along line 3—3 of FIG. 2 of a portion of a semiconductor wafer having conductive portions plated on the bottom surface thereof, photoresist material selectively coated on the top surface thereof, and bonding material securing the semiconductor wafer to a mounting plate.
Figure 4:
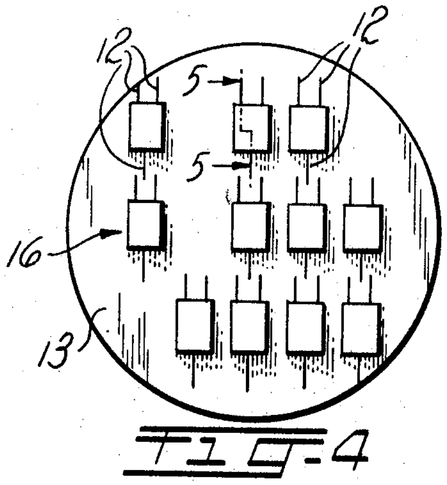
FIG. 4 is a top elevation of a plurality of three-lead, beam lead devices formed by removing portions of the semiconductor wafer shown in FIG. 2.

Referring to the drawing, FIG. 1 depicts a typical, three-lead, beam lead device 16 having leads 12 of gold or other suitable metal extending, like cantilever beams, from the body of the device 16. As illustrated in FIGS. 2 and 3, a large number of beam lead devices 16 are fabricated from a semiconductor wafer 11 bonded to a mounting plate 14 by a water insoluble bonding material 13, such as a mounting wax known as "Bi Wax B–7050" commercially available from Bi Wax Company, Des Plaines, Ill. The upper surface of the semiconductor wafer 11 has a predetermined pattern of photoresist material 17 coated thereon. The resist material 17 is hereinafter referred to as resist. The semiconductor wafer 11 is treated with an etching solution to remove all portions of the wafer 11 that are not protected by the resist 17. As shown in FIG. 4, each separated beam lead device 16 is formed as part of a close-packed, ordered array having its beam leads 12 intermeshed with those of adjacent devices 16. The close spacing is necessary to permit fabrication of the maximum number of devices 16 from a single semiconductor wafer 11. Although it is economically desirable to fabricate the maximum number of devices 16 from a single semiconductor wafer 11, it must be realized that such a close-packed array makes resist removal a difficult problem. The devices 16 are very small and fragile; and, consequently, it is imperative that any technique for removing resist 17 from a device 16 does not disorient the device thereby damaging its beam leads 12 or damaging the leads 12 of an adjacent device 16. It is also imperative that the device 16 remain in its original orientation to facilitate subsequent handling and transferring procedures.

Figure 5:
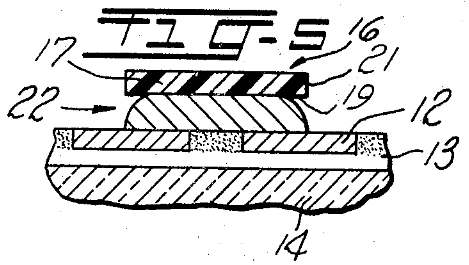
FIG. 5 is a sectional view taken along line 5—5 of FIG. 4 of a beam lead device having a photoresist material on its top surface and being affixed by a bonding material to a mounting plate.

In FIG. 5 a single beam lead device 16 is shown bonded to a portion of a mounting plate 14. It is apparent that the edge of the resist 17 overhangs the edge of the semiconductor body of the beam lead device 16. The peripheral lip 19 projecting over the edge of the device 16 is formed by the corrosive action of the etching solution as it etches away the exposed portions of the semiconductor wafer 11. As the etching solution etches down into the exposed portions of the wafer 11, it also etches into a portion of the semiconductor wafer 11 under the resist 17. The length of the projecting lip 19 is dependent upon the time that the etching solution is permitted to etch the exposed portion of the wafer 11 under the resist 17, and under normal etching conditions is usually no greater than the thickness of the wafer 11 being etched. After the exposed portion of the wafer 11 is removed, and bonding material underlying it is exposed, the excess etching solution is rinsed away to prevent the possibility of removing an undesirable excess of the wafer 11 under the resist 17.

After the separated devices 16 are rinsed free of excess etching solution, the resist 17 is removed from their surfaces by projecting or impinging a stream of pressurized fluid 18, such as water, at an acute angle against the edge 21 of the projecting lip 19 and against the now exposed bonding material 13 on the surface of the mounting plate 14 adjacent the devices 16. The portion of the projected fluid stream 18 that is directed against the surface of the bonding material 13 rebound against the underside of the projecting lips 19.

Figure 6:
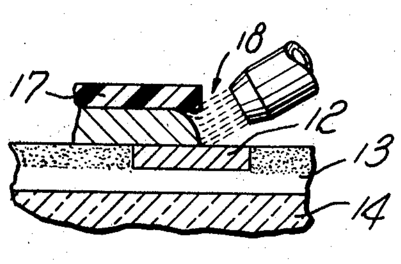
FIG. 6 is an enlarged sectional front elevation of a portion of a beam lead device being subjected to a stream of fluid in accordance with the invention.
Figure 7:
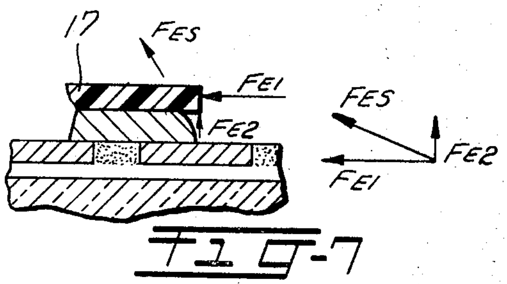
FIG. 7 is an enlarged sectional front elevation of a portion of the beam lead device shown in FIG. 6 wherein the projected fluid stream is illustrated by its effective force components.

Referring to FIGS. 6 and 7, the angle of incidence of the fluid stream 18 is shown as being selected so that a net effective force component $F_{ES}$ acting on the projecting lip 19 is sufficiently great to initiate separation of the resist 17 from the device 16. The actual force pattern acting on the projecting lip 19 is very complex and is made considerably more complex by the size of the device 16 and the turbulence of the fluid stream 18 in the crevice 22 defined by bonding material 13 on the mounting plate 14, the edge of the device 16, and the projecting lip 19. However, it is believed that the effective force components, those that actually remove the resist 17, are $F_{E1}$, acting perpendicularly against the edge 21 of the projecting lip 19 and $F_{E2}$, acting perpendicularly against the underside of the projecting lip 19.

Although, as illustrated in FIG. 7, the required net effective force $F_{ES}$, the vectoral sum of force components $F_{E1}$ and $F_{E2}$, necessary to remove the resist 17 from the device 16 is essentially a constant, the force components $F_{E1}$ and $F_{E2}$ vary as a function of the pressure of the fluid stream 18, the length and thickness of the projecting lip 19, the reflectivity of the bonding material 13 with respect to the impinging fluid stream 18, and the turbulence in the crevice 22. Since the variables upon which $F_{ES}$ depends may themselves vary in an unpredictable manner from one device 16 to another, a simple formula for the net effective force component $F_{ES}$ is unascertainable. However, it may be generally stated that the pressure of the fluid stream 18 must be increased as the angle of incidence of the stream becomes less acute. Conversely, as the angle of incidence of the fluid stream 18 becomes more acute, a lower stream pressure is required to produce the net effective force $F_{ES}$. The maximum angle of incidence is dependent upon the maximum allowable pressure of the fluid stream 18, which is, in turn, dependent upon the strength of the bond between the bonding material 13 and the device 16 and between the bonding material 13 and the mounting plate 14. When a mounting wax, such as "Bi Wax B–7050," is used to bond the device 16 to the mounting plate 14, the maximum angle of incidence approaches 80° and the maximum allowable stream pressure is approximately 150–200 p.s.i.g. When the stream pressure approaches the maximum allowable pressure, there is a possibility that the device 16 may be torn from the bonding material 13, or that the device 16 and the bonding material 13 may be torn from the mounting plate 14. It should be noted that the maximum allowable stream pressure is increased when the fluid stream 18 is directed from the central portions toward the periphery of the mounting plate 14 because by doing so there is no possibility of the fluid stream 18 prying under the edge of the bonding material 13 and peeling it from the mounting plate 14.

Figure 8:
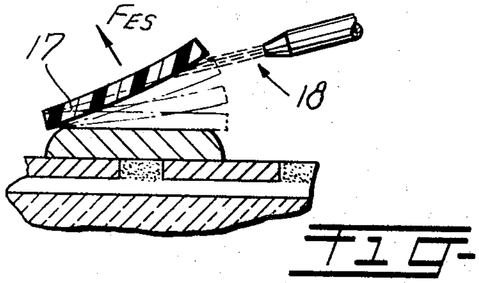
FIG. 8 is an enlarged sectional front elevation of a portion of a beam lead device depicting the removal of a layer of resist material in accordance with the invention.

After selecting a suitable angle of incidence and a suitable stream pressure, the fluid stream 18, as illustrated in FIG. 6, is projected against the edge 21 of the projecting lip 19 and against the surface of the bonding material 13 adjacent the device 16 to subject the projecting lip 19 to the net effective force $F_{ES}$ and initiate separation of the resist 17 from the device 16. As shown in FIG. 8, the fluid stream 18 is then directed against the underside of the projecting lip 19 and against the newly exposed surface of the resist 17 to completely peel or remove the resist 17 from the device 16. After the resist 17 is completely removed from one device 16, the fluid stream 18 is projected at the edge 21 of the projecting lip 19 of the resist 17 on another device 16, and so on, until the resist 17 is removed from all the devices 16 on the mounting plate 14.

It should be understood that the method of this invention is not limited to the removal of resist 17 from a single device 16 and that a plurality of fluid streams 18 or a single stream having a preselected configuration may be projected against a plurality of devices 16 to accomplish resist removal from a plurality of devices at one time. In one such technique, a single stream of fluid 18 is swept back and forth across the length of the mounting plate 14 to act successively upon the devices in a particular row (see FIG. 4). After the resist 17 is removed from one row of devices 16, the projected stream 18 is advanced relative to the mounting plate 14 to act upon the next successive row of devices. The stream 18 may be advanced with respect to the mounting plate 14 manually or by use of automatic facilities. If the resist 17 is not completely removed from one or more of the devices 16 in a particular row, the fluid stream 18 may be turned and directed back toward the unremoved resist 17 either at the same angle or a slightly larger or smaller angle with respect to the surface of the mounting plate 14 before advancing to the next successive row of devices.

Several examples of methods in accordance with this invention are described in detail below. These examples are included merely to aid in the understanding of the invention, and variations may be made by one skilled in the art without departing from the spirit and scope of this invention. Listed below are three examples directed to the practice of the present invention.

Example 1

A 1 inch diameter by 0.002 inch thick activated silicon wafer having 0.0005 inch thick gold leads plated on the active side thereof was bonded to a 1¼ inch diameter by 0.030 inch thick aluminum oxide mounting plate with a 0.0007 inch layer of "Bi Wax B–7050" wax except at lead sites where the wax was only 0.0002 inch thick. The wax was purchased from Bi Wax Company, Des Plaines, Ill. The top surface of the silicon wafer was coated with a 30,000 A. layer of "KTFR" photoresist purchased from Eastman Kodak Company, Rochester, N.Y. The "KTFR" resist was baked for 1 hour at 70° C. and then covered by an opaque mask having 0.052 inch by 0.052 inch cut-outs corresponding to each device location. The "KTFR" resist was exposed to ultra-violet light for 30 seconds and developed. The unexposed "KTFR" resist was removed from the silicon wafer and the wafer was subjected to an etching solution for 8 minutes at room temperature. The etching solution consisted of 4 parts 70% nitric acid ($HNO_3$), 1 part 49% hydrofluoric acid (HF) and 3 parts glacial acetic acid ($CH_3COOH$). The etching step formed a plurality of separate beam lead devices and undercut the "KTFR" resist on each device, leaving a peripheral lip of "KTFR" resist projecting approximately 0.002 inch beyond the edges of each device. The mounted devices were placed in a bath of running water for ten minutes to rinse away any excess etching solution. A thread-like water stream having a circular cross section (for example, ⅛ inch to 1⁄16 inch) was projected at a 45° angle against the edge of the projecting lip of "KTFR" resist on a single device and against the now exposed "Bi Wax B–7050" wax on the surface of the mounting plate adjacent the device. The water was projected with a type VL–3, "Paasche Air Brush" spraying device purchased from the Paasche Air Brush Company, Chicago, Ill., using air at 50 p.s.i.g. as a propellant. The net effective force of the stream of water acting against the projecting lip of the "KTFR" resist layer was sufficient to completely remove the "KTFR" resist layer from the device. The "KTFR" resist was removed from all of the devices on the mounting plate in approximately 10 seconds.

Example 2

The procedure of Example 1 was followed except that the stream of water was projected at an angle of 5° using 10 p.s.i.g. air as the propellant. The "KTFR" resist layer was completely removed from all of the devices on the mounting plate in approximately 20 seconds.

Example 3

The procedure of Example 1 was followed except that the stream of water was projected at an angle of 70° using 100 p.s.i.g. air as the propellant. The "KTFR" resist layer was completely removed from all of the devices on the mounting plate in 10–20 seconds.

It should be understood that the above examples in no way limit the scope of this invention and are intended merely as illustrations of the manner in which the present invention may be practiced. It should be obvious to one skilled in the art that the present invention is in no way limited to the removal of resist material from a beam lead device and that the method of the present invention contemplates numerous modifications within the spirit and scope of this invention.

What is claimed is:

1. A method of removing a peelable layer of polymerized photoresist bonded with a predetermined adhesion force to a substrate, said substrate being affixed to a mounting plate extending beyond at least one edge of said substrate, which comprises the steps of:

undercutting the edge of the substrate to create a lip of the resist material projecting beyond said edge;

projecting a stream of liquid at an acute angle of incidence against the edge of said projecting lip and against the surface of the extended portion of said mounting plate, said angle being selected to direct a first effective liquid force component perpendicularly against said edge of said projecting lip and a second effective liquid force component perpendicularly against the underside of said projecting lip whereupon said first force component acting in conjunction with said second force component overcomes said predetermined adhesive force at the interface between said resist layer and said substrate and initiates separation of said resist layer from said substrate; and continuing to project said liquid stream against said underside of said projecting lip and against newly exposed portions of said resist layer to completely remove said layer from said device.

2. The method of claim 1 wherein the stream of liquid is projected from a source by a propellant at a pressure of from 10 to 100 p.s.i.g. and the angle of incidence of the stream is between 5° and 80°.

3. The method of claim 1 wherein the stream of liquid is projected from a source by a propellant at a pressure of from 10 to 50 p.s.i.g. and the angle of incidence of the stream is between 5° and 60°.

4. In a method of fabricating a beam lead device wherein an array of metallic leads are secured to the underside of a semiconductor chip and the chip is mounted on a support plate, applying a pattern of photoresist to the chip to overlay sections of each lead in said array, subjecting said exposed portions of said semiconductor chip to an etching solution to dissolve said exposed portions as well as a portion of the chip underneath said resistant material to leave a peripheral lip of resistant material projecting over the now exposed surface of said support plate, applying a liquid stream to the exposed surface of said support plate at an acute angle with sufficient force to rebound the liquid from said plate against a section of said projecting lip to initiate separation of said resist from said chip, and continuing to project said liquid stream against said initially separated resist to complete the removal of the resistant material from said chip.

5. The method of claim 2 wherein the stream of liquid is projected from a source by a propellant at a pressure of from 10 to 100 p.s.i.g. and the angle of incidence of the stream is between 5° and 80°.

6. In a method as defined in claim 4, wherein said semiconductor chip is mounted on said support plate with a water insoluble wax and the liquid stream is a stream of water.

References Cited

UNITED STATES PATENTS

| | | | |
|---|---|---|---|
| 872,314 | 1907 | Wilson | 134—34 |
| 3,240,601 | 3/1966 | Stalnecker et al. | 96—36.2 |
| 3,082,136 | 4/1963 | Finn | 156—17 |

JACOB H. STEINBERG, Primary Examiner

U.S. Cl. X.R.

134—28; 96—36.2; 156—345